US008994472B2

(12) United States Patent
Yamaji et al.

(10) Patent No.: US 8,994,472 B2
(45) Date of Patent: Mar. 31, 2015

(54) ANTENNA DUPLEXER

(75) Inventors: Toru Yamaji, Osaka (JP); Kazunori Nishimura, Kyoto (JP); Joji Fujiwara, Osaka (JP); Hiroyuki Nakamura, Osaka (JP)

(73) Assignee: Panasonic Corporation, Osaka (JP)

( * ) Notice: Subject to any disclaimer, the term of this patent is extended or adjusted under 35 U.S.C. 154(b) by 585 days.

(21) Appl. No.: 13/353,350

(22) Filed: Jan. 19, 2012

(65) Prior Publication Data

US 2012/0188026 A1 Jul. 26, 2012

(30) Foreign Application Priority Data

Jan. 26, 2011 (JP) ................................ 2011-013615

(51) Int. Cl.
*H03H 9/72* (2006.01)
*H03H 9/64* (2006.01)
*H03H 9/145* (2006.01)

(52) U.S. Cl.
CPC ......... *H03H 9/6483* (2013.01); *H03H 9/14535* (2013.01); *H03H 9/725* (2013.01)
USPC ........................................ 333/133; 333/195

(58) Field of Classification Search
CPC .. H03H 9/14535; H03H 9/6483; H03H 9/725
USPC ................ 333/133, 187, 193, 194, 195, 196; 310/313 B, 313 D
See application file for complete search history.

(56) References Cited

U.S. PATENT DOCUMENTS

| | | | | |
|---|---|---|---|---|
| 5,831,493 | A | 11/1998 | Ushiroku | |
| 6,326,864 | B1 | 12/2001 | Takamine et al. | |
| 2008/0150652 | A1 * | 6/2008 | Itou | 333/133 |
| 2010/0188166 | A1 * | 7/2010 | Hara et al. | 333/133 |
| 2010/0259341 | A1 * | 10/2010 | Nakai | 333/193 |

FOREIGN PATENT DOCUMENTS

| | | |
|---|---|---|
| JP | 9-055640 | 2/1997 |
| JP | 2000-261288 | 9/2000 |
| JP | 2001-308676 | 11/2001 |

* cited by examiner

*Primary Examiner* — Benny Lee
*Assistant Examiner* — Jorge Salazar, Jr.
(74) *Attorney, Agent, or Firm* — Lando & Anastasi, LLP

(57) ABSTRACT

An antenna duplexer includes first and second filters connected to an antenna terminal. The first filter has a passband of a low frequency band. The second filter has a passband of a high frequency band. The second filter is a ladder-type filter including series-arm resonators and parallel-arm resonators. At least one parallel-arm resonator out of the parallel-arm resonators has a main resonance and an auxiliary resonance. Attenuation poles caused by the main resonance and the auxiliary resonance are within the low frequency band. This antenna duplexer has a high attenuation characteristic and a high isolation characteristic while maintaining a low insertion loss.

20 Claims, 12 Drawing Sheets

External Circuit
External Circuit
2A 4A 3A 3 1 2 4 5 6 21 19 17 15 14 12 10 8 25 20 18 16 13 11 9 7 1A External Circuit
External Circuit
4A
4
7
8
1
9
10
11
6
12
13
14
1A
3A
3
25
15
16
17
18
19
5
20
21
2A
2

101
123B
23B
22
22A
424B
24C
424C
24A
124
124B
124A
224B
224
224A
424A
24B
24
324
23A
123A
Pitch
Pmin
Position 102
23B
22
123B
124B
224B
424B
24A
424C
24B
424A
24A
24
123A
23A
Position
Pitch
Pmin 103
23B
22
124B
224B
424B
24A
424C
24B
424A
24A
24
23A
Position
Pitch
Pmin 104
22
23A
23B
24
24B
124B
224B
424A
424B
424C
524A
524A
Pitch
PU
PC
PL
Pmin
Position 105
22
23A
23B
24
24A
24B
24C
24F
424A
424B
424C
123A
123B
124B
224B
Pitch
Pmin1
Pmin2
Position 106
23B
22
124B
224B
424B
24C
24A
424C
24D
24A
424A
24B
24
23A
Pitch 107
22
22A
123B
23B
223B
323B
424B
24C
424C
24A
124B
224B
424A
24B
24
323A
223A
123A
23A
Pitch
Pmin
Position

ANTENNA DUPLEXER

The present application claims priority to foreign patent application JP 2011-013615 filed on Jan. 26, 2011

FIELD OF THE INVENTION

The present invention relates to an antenna duplexer that is mainly used in an electronic device, such as a mobile phone, and that branches a transmission wave and a reception wave.

BACKGROUND OF THE INVENTION

In recent years, a demand for antenna duplexers has been increasing due to a rapid spread of mobile phones using a communication system, such as Wideband Code Division Multiple Access (W-CDMA), performing simultaneous transmission and reception. Antenna duplexers are implemented by small, low profile, and mass-productive acoustic wave elements, such as a surface acoustic wave (SAW) element, a boundary elastic wave element, or a bulk acoustic wave element.

An antenna duplexer generally includes a transmission filter and a reception filter in order to branch a transmission band signal and a reception band signal higher than the reception band signal. These filters may often employ ladder-type filters including series-arm resonators and parallel-arm resonators connected in a ladder arrangement.

In recent years, in order to eliminate an interstage filters used for a radio circuit, an antenna duplexer has required to have a higher performance than conventional duplexers. Specifically, such an antenna duplexer has been required that has improved attenuation characteristic and isolation characteristic while having an insertion loss equal to an insertion loss of the conventional duplexers. In particular, the reception filter is required to have an improved attenuation characteristic and isolation characteristic in a transmission band.

For example, Band 2 specified by the 3rd Generation Partnership Project (3GPP) standard, the transmission band ranges from 1850 MHz to 1910 MHz and the reception band ranges from 1930 MHz to 1990 MHz. This specification has a very wide passband of 60 MHz and a very narrow interval between the transmission band and the reception band. This configuration hardly provides an antenna duplexer with both of a low insertion loss and a high attenuation.

Other bands, such as Band 3 and Band 8, on the other hand, require an antenna duplexer that has a characteristic steeper and wider than that of Band 2.

Japanese Patent Laid-Open Publication No. 9-55640 discloses a ladder-type filter. In the ladder-type filter, a distance between an IDT electrode and a reflector to produce spurious emission in a one-port resonator. Japanese Patent Laid-Open Publication No. 9-55640 describes that the one-port resonator is used as a parallel-arm resonator of a filter to provide the filter with a steep characteristic in a low band-side of the band. However, the one-port resonator producing the spurious emission has high impedance between a spurious resonance frequency and a main resonance frequency. This provides the filter with a poor attenuation characteristic at a frequency causing the high impedance, thus failing to provide a high attenuation characteristic.

In a filter disclosed in Japanese Patent Laid-Open Publication No. 2001-308676, a one-port resonator producing a spurious emission has a low Q value at a spurious resonance and a high Q value at a main resonance. Japanese Patent Laid-Open Publication No. 2001-308676 describes that this reduces impedance between the main resonance and the spurious resonance, thus providing a favorable attenuation characteristic at a frequency between the main resonance frequency and the spurious resonance frequency. However, this configuration causes insufficient spurious resonance frequency at the spurious resonance frequency due to the low Q value at the spurious resonance.

Japanese Patent Laid-Open Publication No. 2000-261288 discloses a ladder-type filter in a conventional antenna duplexer. In a resonator of the ladder-type filter, electrode fingers of the IDT electrode are arranged partially at a different pitch to provide the resonator with a spurious resonance. This ladder-type filter including the resonator in a series arm has a steep characteristic at a high frequency side in the passband. Japanese Patent Laid-Open Publication No. 2000-261288 also discloses that a ladder filter including a resonator in the series arm can be applied to a duplexer. At least one electrode finger interval different from other electrode finger intervals provides another resonator having a spurious resonance.

A mere application of the techniques disclosed in the above patent documents to an antenna duplexer cannot provide an antenna duplexer having a steep and wide-band high attenuation characteristic required by Band 2, Band 3, and Band 8. Further, these patent documents do not disclose or even suggest a technique realizing the high isolation characteristic specifically required particularly for the antenna duplexer.

SUMMARY OF THE INVENTION

An antenna duplexer includes first and second filters connected to an antenna terminal. The first filter has a passband of a low frequency band. The second filter has a passband of a high frequency band. The second filter is a ladder-type filter including series-arm resonators and parallel-arm resonators. At least one parallel-arm resonator out of the parallel-arm resonators has a main resonance and an auxiliary resonance. Attenuation poles caused by the main resonance and the auxiliary resonance are within the low frequency band.

This antenna duplexer has a high attenuation characteristic and a high isolation characteristic while maintaining a low insertion loss.

DETAIL DESCRIPTION OF PREFERRED EMBODIMENTS

Figure 1:
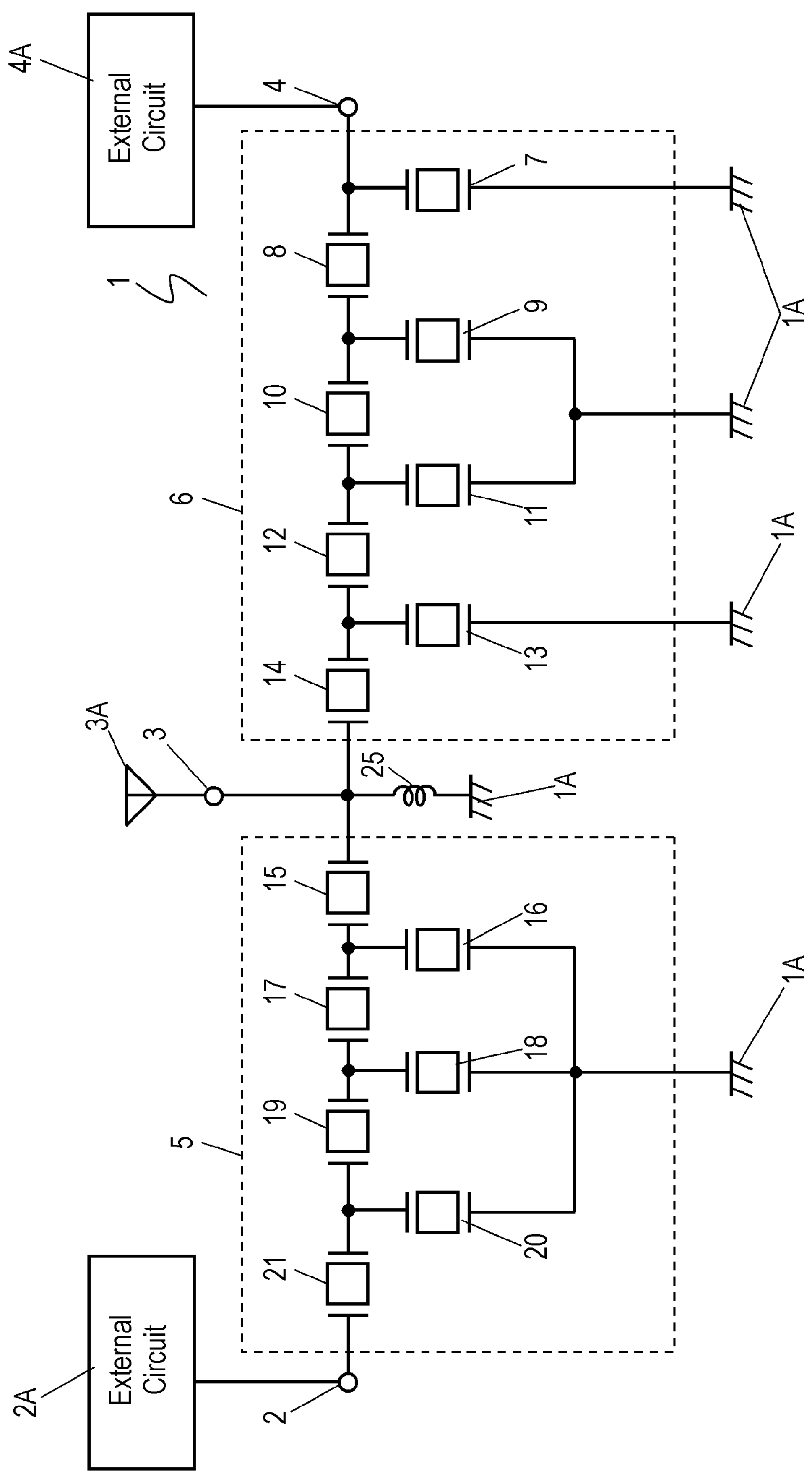
FIG. 1 is a circuit diagram of an antenna duplexer according to an exemplary embodiment of the present invention.

FIG. 1 is a circuit diagram of antenna duplexer 1 according to an exemplary embodiment of the present invention. Antenna duplexer 1 includes input terminal 2 for receiving a transmission signal, antenna terminal 3 configured to be connected to antenna 3A, output terminal 4 for outputting a reception signal, filter 5 connected between input terminal 2 and antenna terminal 3 in series, and filter 6 connected between output terminal 4 and antenna terminal 3 in series. Filter 5 has a passband of a low frequency band. Filter 6 has a passband of a high frequency band higher than the low frequency band. The high frequency band has the lowest frequency higher than the highest frequency of the low frequency band. Antenna duplexer 1 further includes inductor 25 connected between antenna terminal 3 and ground 1A. Inductor 25 functions as a phase shifter to provide the impedance matching between filters 5 and 6 at antenna terminal 3. Input terminal 2 is configured to be connected to external circuit 2A. According to this embodiment, external circuit 2A is a transmission circuit for inputting the transmission signal to input terminal 2. Output terminal 4 is configured to be connected to external circuit 4A. According to this embodiment, external circuit 4A is a reception circuit that receives the reception signal outputted from output terminal 4.

Filter 5 is a ladder-type acoustic wave filter that includes series-arm resonators 15, 17, 19, and 21 connected along a signal path in series, and parallel-arm resonators 16, 18, and 20 connected between the signal path and ground 1A. Filter 6 is a ladder-type elastic wave filter that includes series-arm resonators 8, 10, 12, and 14 connected along a signal path in series, and parallel-arm resonators 7, 9, 11, and 13 connected between the signal path and ground 1A. Series-arm resonators 8, 10, 12, 14, 15, 17, 19, and 21 as well as parallel-arm resonators 7, 9, 11, 13, 16, 18, and 20 are formed on a surface of a piezoelectric substrate. Thus, these resonators are acoustic wave resonators.

Specifically, in filter 5, series-arm resonators 15, 17, 19, and 21 are connected between antenna terminal 3 and input terminal 2 in series. Parallel-arm resonators 16, 18, and 20 are connected between ground 1A and series-arm resonators 15, 17, 19, and 21 to configure a ladder-type filter together with series-arm resonators 15, 17, 19, and 21.

In filter 6, series-arm resonators 8, 10, 12, and 14 are connected between antenna terminal 3 and output terminal 4 in series. Parallel-arm resonators 7, 9, 11, and 13 are connected between ground 1A and series-arm resonators 8, 10, 12, and 14 to configure a ladder-type filter together with series-arm resonators 8, 10, 12, and 14. A configuration of filter 6 will be described below.

At least one parallel-arm resonator out of parallel-arm resonators 7, 9, and 11 other than parallel-arm resonator 13 connected closest to antenna terminal 3 among parallel-arm resonators 7, 9, 11, and 13 of filter 6 have plural resonances. This provides antenna duplexer 1 with filter 5 prevented from having a high insertion loss and filter 6 having a large attenuation in the low frequency band.

Parallel-arm resonator 7 out of parallel-arm resonators 7, 9, 11, and 13 that is connected at the farthest position from antenna terminal 3 in the circuit and that is connected at the closest position to output terminal 4 preferably has the plural resonances.

Figure 2:
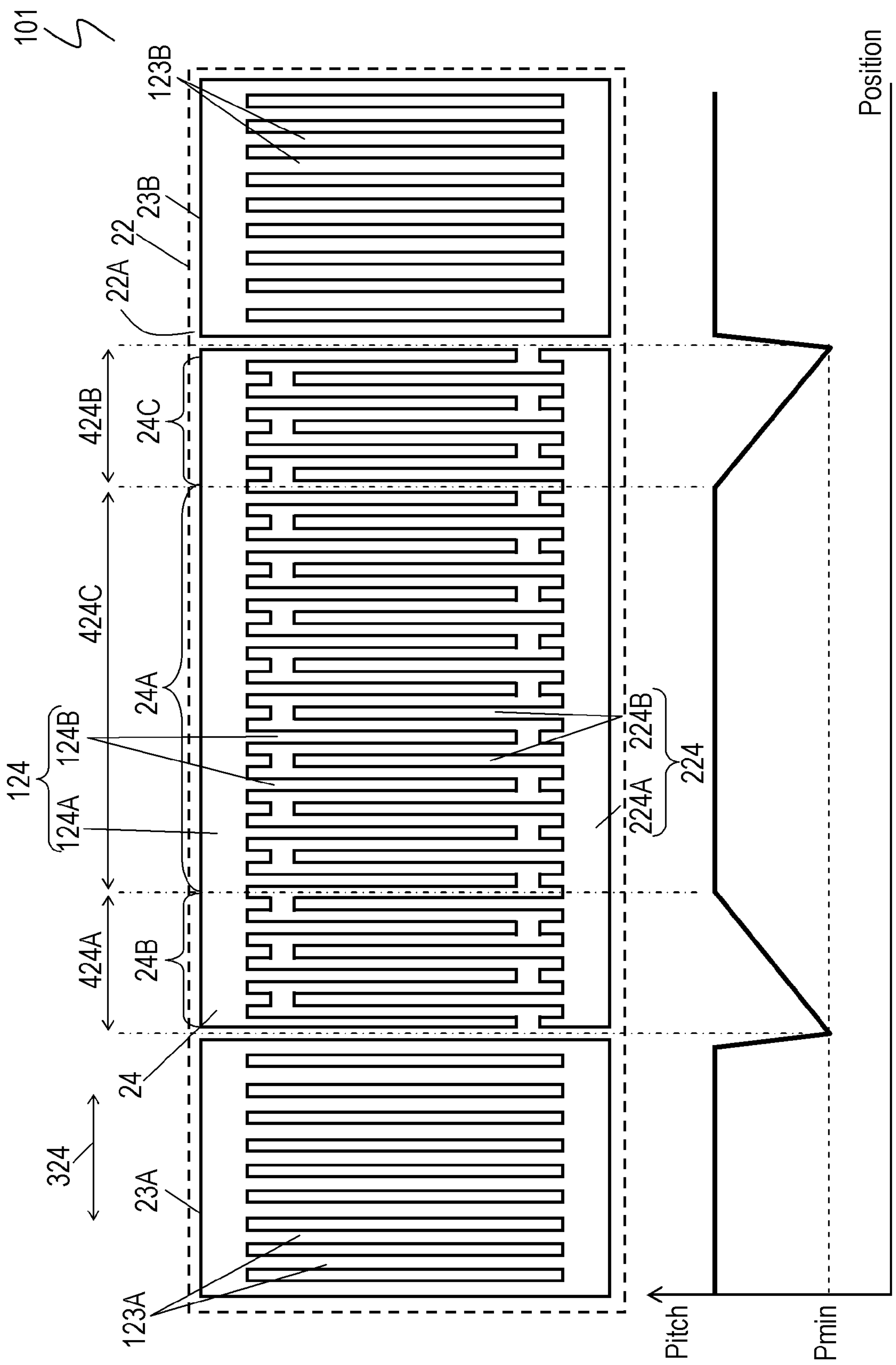
FIG. 2 is a schematic view of a parallel-arm resonator of the antenna duplexer according to the embodiment.

FIG. 2 is a schematic view of parallel-arm resonator 101 having the plural resonances that is at least one parallel-arm resonator out of parallel-arm resonators 7, 9, and 11 of filter 6 of antenna duplexer 1 according to the embodiment. Parallel-arm resonator 101 includes two reflectors 23A and 23B provided on surface 22A of piezoelectric substrate 22, and interdigital transducer (IDT) electrode 24 provided between two reflectors 23A and 23B. IDT electrode 24 includes comb-shaped electrodes 124 and 224 facing each other. Comb-shaped electrode 124 includes busbar 124A extending in direction 324 and electrode fingers 124B extending from busbar 124A. Comb-shaped electrode 224 includes busbar 224A extending in direction 324 in parallel with busbar 124A and electrode fingers 224B extending from busbar 224A. Electrode fingers 124B and 224B are arranged alternately in direction 324. Electrode fingers 124B and 224B interdigitate with each other to generate an acoustic wave. Reflector 23A includes electrode fingers 123A arranged in direction 324. Reflector 23B includes electrode fingers 123B arranged in direction 324. FIG. 2 also shows the relation between the positions of electrode fingers 123A, 123B, 124B, and 224B and a pitch of electrode fingers 123A, 123B, 124B, and 224B. IDT electrode 24 has narrow pitch sections 24B and 24C as well as constant pitch section 24A provided between narrow pitch sections 24B and 24C. Narrow pitch sections 24B and 24C are provided at end portions 424A and 424B adjacent to reflectors 23A and 23B of IDT electrode 24, respectively. Constant pitch section 24A is provided at intermediate portion 424C between end portions 424A and 424B of IDT electrode 24. In narrow pitch sections 24B and 24C, electrode fingers 124B and 224B are arranged at a pitch narrower than in constant pitch section 24A. Parallel-arm resonator 101 has, in the low frequency band as a passband of filter 5, plural attenuation poles: an attenuation pole caused by a main resonance due to constant pitch section 24A and an attenuation pole caused the auxiliary resonance due to narrow pitch section 24B. In constant pitch section 24A, electrode fingers 124B and 124B are arranged substantially at a constant pitch.

Piezoelectric substrate 22 is a piezoelectric single-crystal substrate composed of, e.g. lithium niobate ($LiNbO_3$) or lithium tantalate ($LiTaO_3$). A dielectric layer may be provided on surface 22A of piezoelectric substrate 22. This dielectric layer is may be made of silicon oxide ($SiO_2$), silicon nitride (SiN), aluminum nitride (AlN), or a layered structure of these substances.

Reflectors 23A and 23B as well as IDT electrode 24 are made of a single metal of aluminum, copper, silver, gold, titanium, tungsten, molybdenum, platinum, or chrome, alloy including these metals as main components, or a layered structure of the metals. IDT electrode 24 may excites, as a main wave, a surface acoustic wave, such as a Shear Horizontal (SH) wave or a Rayleigh wave, or a bulk wave, such as a Lamb wave.

Characteristics of parallel-arm resonator 101 will be detailed below. First, a sample of parallel-arm resonator 101 is prepared for which the characteristic is to be measured. In the sample, IDT electrode 24 includes one hundred fifty electrode fingers 124B and one hundred fifty electrode fingers 224B. A width along which electrode fingers 124B and 224B interdigitate with each other is 40 μm. Reflector 23A includes thirty electrode fingers 123A. Reflector 23B includes thirty electrode fingers 123B. A metallization ratio is defined as the ratio of the width of each of electrode fingers 124B and 224B along a direction perpendicular to the direction in which the electrode fingers are arranged to the pitch. The metallization ratio is 0.5. When assuming that the pitch of electrode fingers 124B and 224B in constant pitch section 24A is 1.000, the pitch of electrode fingers 123A and 123B of reflectors 23A and 23B is 1.000. Thus, the ratio of the pitch of electrode fingers 124B and 224B in constant pitch section 24A to the pitch of electrode fingers 123A and 123B of reflectors 23A and 23B is 1.000. Each of narrow pitch sections 24B and 24C includes fifteen electrode fingers 124B and fifteen electrode fingers 224B. The ratio of the pitch of electrode fingers 124B and 224B at a portion of narrow pitch section 24B closest to reflector 23A to the pitch of electrode fingers 124B and 224B in constant pitch section 24A is 0.970. The ratio of the pitch of electrode fingers 124B and 224B in narrow pitch section 24B linearly decreases to 0.998, 0.996, 0.994 . . . as located away from constant pitch section 24A, and reaches minimum pitch Pmin. Similarly, the ratio of the pitch of electrode fingers 124B and 224B at a portion of narrow pitch section 24C closest to reflector 23B to the pitch of electrode fingers 124B and 224B in constant pitch section 24A is 0.970. The ratio of the pitch of electrode fingers 124B and 224B in narrow pitch section 24C linearly decreases to 0.998, 0.996, 0.994 . . . as located away from constant pitch section 24A, and reaches minimum pitch Pmin. The interval between IDT electrode 24 and each of reflectors 23A and 23B is an average of the pitch of electrode fingers 124B and 224B of IDT electrode 24 at the portion closest to reflectors 23A and 23B and the pitch between of fingers 123A and 123B of reflectors 23A and 23B.

Figure 3:
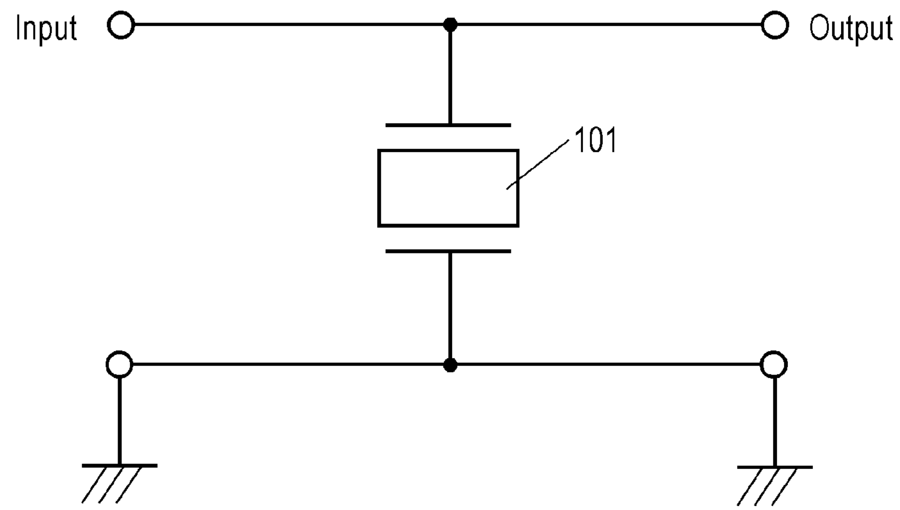
FIG. 3 is a circuit diagram of a circuit for measuring characteristics of the parallel-arm resonator shown in FIG. 2.
Figure 4:
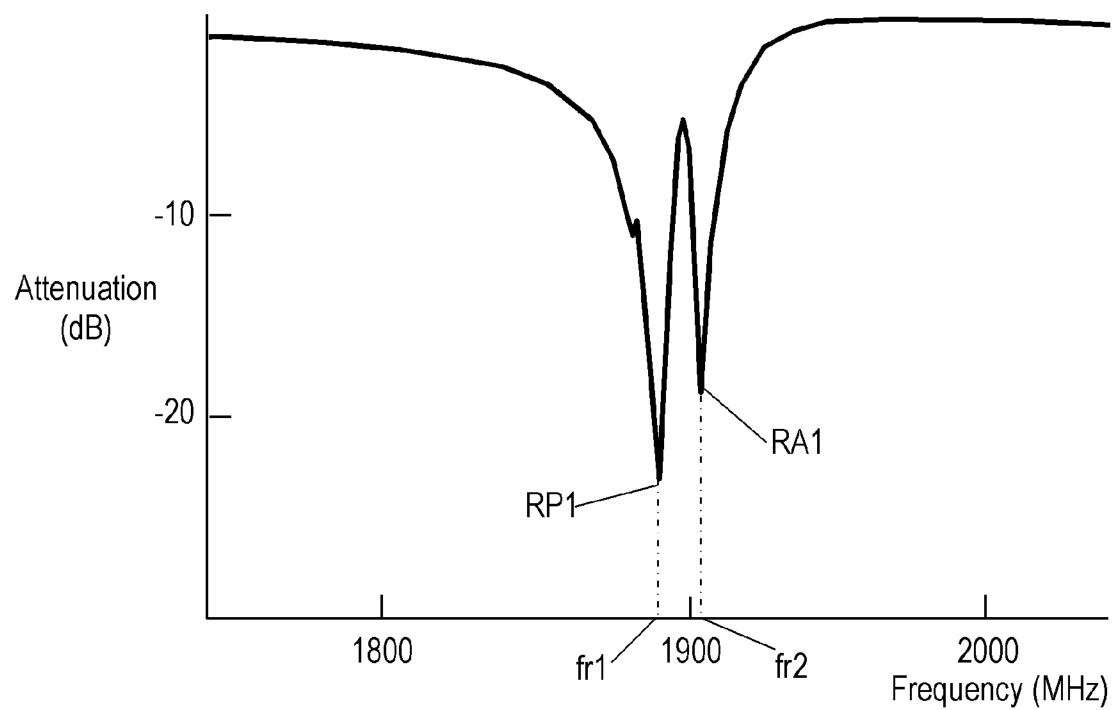
FIG. 4 illustrates a propagation characteristic of the parallel-arm resonator shown in FIG. 2.

FIG. 3 is a circuit diagram of a circuit for measuring characteristics of the sample of parallel-arm resonator 101. FIG. 4 illustrates a propagation characteristic of parallel-arm resonator 101 measured by the circuit shown in FIG. 3. Narrow pitch sections 24B and 24C provided at an end portion of IDT electrode 24 provides two attenuation poles caused by main resonance RP1 and auxiliary resonance RA1 shown in FIG. 4, respectively. Main resonance RP 1 is derived from the radiation characteristic of IDT electrode 24. Auxiliary resonance RA1 has resonance frequency fr2 that is higher than resonance frequency fr1 at main resonance RP1 and that is caused by the resonance between IDT electrode 24 and reflectors 23A and 23B. The difference between resonance frequency fr1 and resonance frequency fr2 (fr2−fr1) preferably satisfies the following relation.

$$0.004 \leq (fr2-fr1)/fr1 \leq 0.015$$

The difference may satisfy the following relation.

$$0.006 \leq (fr2-fr1)/fr1 \leq 0.010$$

Parallel-arm resonator 101 having both of main resonance RP1 and auxiliary resonance RA1 is preferably used as parallel-arm resonator 7 of antenna duplexer 1 shown in FIG. 1. In this case, auxiliary resonance RA1 of parallel-arm resonator 7(101) preferably has a resonance frequency that is lower than resonance frequencies of at least one parallel resonator out of parallel-arm resonators 9, 11, and 13 other than resonator 7. For example, parallel-arm resonator 13 closest to antenna terminal 3 to have a resonance frequency higher than resonance frequency fr2 of auxiliary resonance RA1 of parallel-arm resonator 7, the attenuation pole near lower frequencies in the passband of filter 6 is caused by a pole derived from the resonance frequency of parallel-arm resonator 13 as a general resonator that does not have an auxiliary resonance but has only a main resonance, thereby providing filter 6 with a steepness at the lower frequencies in the passband.

As described above, antenna duplexer 1 according to the embodiment includes filter 5 having a passband of a low frequency band and filter 6 having a passband of a high frequency band higher than the low frequency band. Filter 6 is a ladder-type filter that includes series-arm resonators 8, 10, 12, and 14 and parallel-arm resonators 7, 9, 11, and 13. At least one parallel-arm resonator of the second and subsequent parallel-arm resonators out of parallel-arm resonators 7, 9, 11, and 13 counted from the electrical connection between filters 5 and 6 have at least two resonances, a main resonance and an auxiliary resonance. In this parallel-arm resonator, at least two attenuation poles caused by the resonances, the main resonance and the auxiliary resonance, are within the low frequency band. This arrangement provides antenna duplexer 1 with a high attenuation characteristic and a high isolation characteristic while maintaining the insertion loss.

In parallel-arm resonator 101 having the main resonance and the auxiliary resonance, the impedance between resonance frequencies fr1 and fr2 of main resonance RP1 and auxiliary resonance RA1 is higher than the other frequencies. Parallel-arm resonator 101 is connected between the signal path and ground 1A in parallel with terminal 3(4), the impedance between resonance frequencies fr1 and fr2 is lower than the other frequencies. If parallel-arm resonator 101 is used as the second and subsequent parallel-arm resonators counted from antenna terminal 3, the impedance of filter 6 seen from the electrical connection between filter 5 and filter 6, i.e., the impedance of filter 6 seen from antenna terminal 3, is high in the low frequency band. This prevents an increase in insertion loss of filter 6 affecting filter 5, thus providing antenna duplexer 1 having a low insertion loss.

At least one parallel-arm resonator, i.e. parallel-arm resonator 7, out of parallel-arm resonators 7, 9, and 11 of filter 6 is resonator 101 having two resonance, main resonance RP1 and auxiliary resonance RA1. This configuration can provide, while preventing an increase in the number of resonators and maintaining a high insertion loss, a favorable attenuation characteristic in a wide band. In particular, the two resonance frequencies of main resonance RP1 and auxiliary resonance RA1 in the low frequency band can increase the attenuation amount in the low frequency band of filter 6.

Resonator 101 having plural resonances is used as parallel-arm resonator 7 out of parallel-arm resonators 7, 9, 11, and 13 of filter 6 that is preferably connected to a position farthest from antenna terminal 3, that is, closest to output terminal 4. If filters 5 and 6 are connected, the impedance of filter 6 seen from antenna terminal 3 can be high at the low frequency band. This can consequently avoid an increase in the insertion loss in filter 5 due to the connection of filters 5 and 6, thus providing antenna duplexer 1 with a low insertion loss.

As described above, antenna terminal 3 is configured to be connected to antenna 3A. Terminal 2, such as the input terminal, is configured to be connected to external circuit 2A, such as the transmission circuit. Terminal 4, such as the output terminal, is configured to be connected to external circuit 4A, such as the reception circuit. Filter 5 is connected between antenna terminal 3 and terminal 2 in series, and has the passband of a low frequency band. Filter 6 is connected between antenna terminal 3 and terminal 4 in series, and has the passband of a high frequency band having the lowest frequency higher than the highest frequency of the low frequency band. Filter 6 includes series-arm resonators 8, 10, 12, and 14 and parallel-arm resonators 7, 9, 11, and 13. Series-arm resonators 8, 10, 12, and 14 are connected between antenna terminal 3 and terminal 4 in series. Parallel-arm resonators 7, 9, 11, and 13 are connected between ground 1A and series-arm resonators 8, 10, 12, and 14 so as to configure a ladder-type filter together with series-arm resonators 8, 10, 12, and 14. Parallel-arm resonator 13 out of plural parallel-arm resonators 7, 9, 11, and 13 is connected to a position closest to antenna terminal 3. Parallel-arm resonators 7, 9, and 11 are connected at positions farther away from antenna terminal 3 than parallel-arm resonator 13 is. At least one parallel-arm resonator, i.e., parallel-arm resonator 7, of parallel-arm resonators 7, 9, and 11 has attenuation poles caused by main resonance RP1 and auxiliary resonance RA1. These attenuation poles are within see the low frequency band.

At least one parallel-arm resonator, parallel-arm resonator 7, may further have a further auxiliary resonance. Attenuation poles caused by the main resonance, the auxiliary resonance, and the further auxiliary resonance are within the low frequency band.

At least one parallel-arm resonator, parallel-arm resonator 7, includes IDT electrode 24 that includes busbars 124A and 224A and electrode fingers 124B and 224B that extend from busbars 124A and 224A and that interdigitate with each other. At least one parallel-arm resonator, such as parallel-arm resonator 7, has narrow pitch sections 24B and 24C in which pitches of electrode fingers 124B and 224B are locally narrow.

Narrow pitch sections 24B and 24C may be provided at end portions 424A and 424B of IDT electrode 24, respectively.

Figure 5:
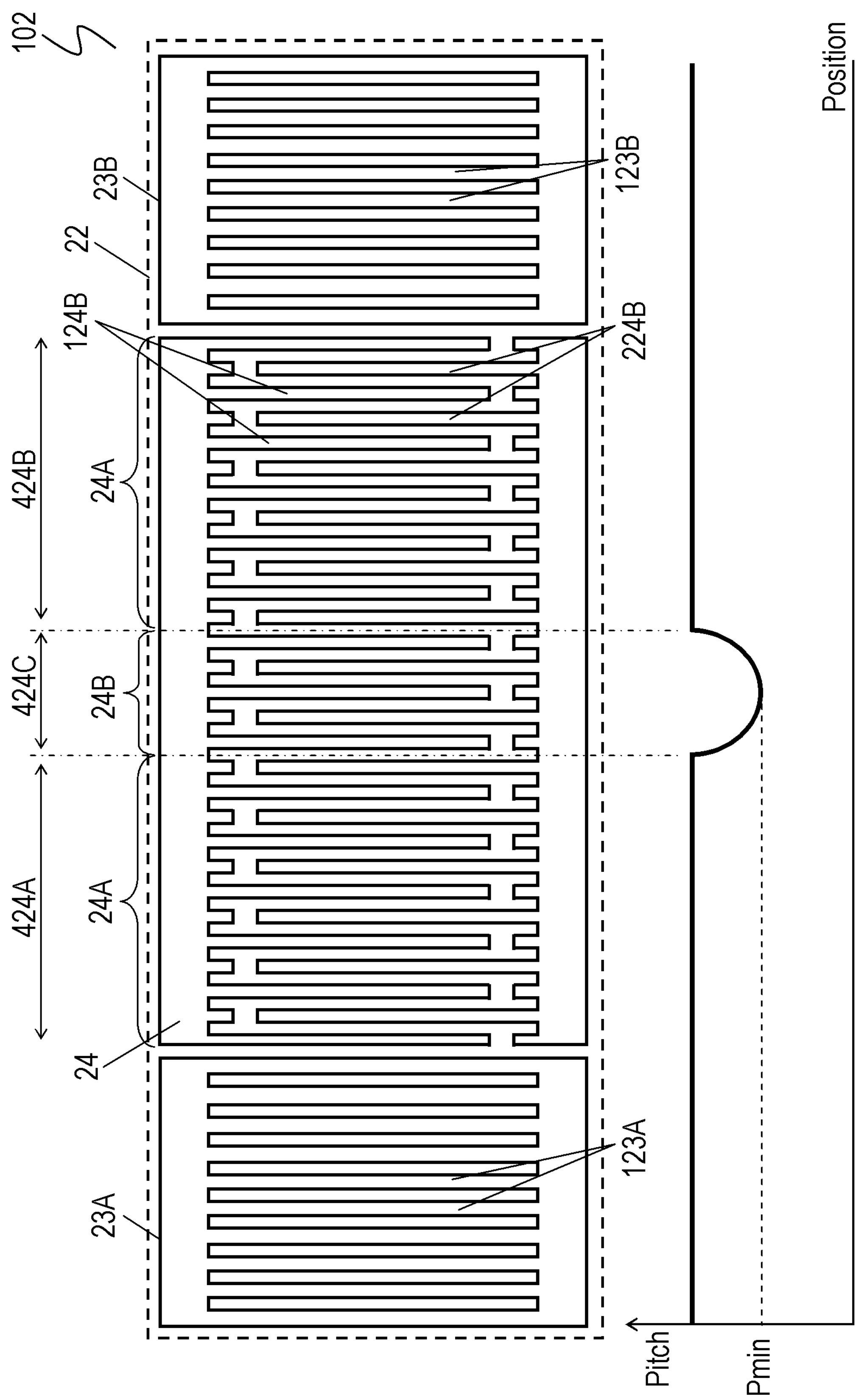
FIG. 5 is a schematic view of another parallel-arm resonator of the antenna duplexer according to the embodiment.

FIG. 5 is a schematic view of another parallel-arm resonator 102 having plural resonances that is at least one parallel-arm resonator of parallel-arm resonators 7, 9, and 11 of filter 6 of antenna duplexer 1 according to the embodiment. In FIG. 5, components identical to those of parallel-arm resonator 101 shown in FIG. 2 are denoted by the same reference numerals. In parallel-arm resonator 102 shown in FIG. 5, narrow pitch section 24B is provided at the center, intermediate portion 424C, of IDT electrode 24. In parallel-arm resonator 102, constant pitch sections 24A are provided at end portions 424A and 424B of IDT electrode 24, respectively. That is, constant pitch sections 24A are provided are provided at both sides of narrow pitch section 24B. At each of end portions 424A and 424B, constant pitch section 24A includes the total of sixty electrode fingers 124B and 224B. Narrow pitch section 24B includes total of thirty electrode fingers 124B and 224B. Reflector 23A includes the total of 30 electrode fingers 123A. Reflector 23B includes the total of 30 electrode fingers 123B. Minimum pitch Pmin is set to the minimum value of the ratio of the pitch between electrode fingers 124B and 224B in narrow pitch section 24B to the pitch between electrode fingers 124B and 224B in constant pitch section 24A. Minimum pitch Pmin is 0.980. The ratio of the pitch between electrode fingers 124B and 224B in narrow pitch section 24B to the pitch between electrode fingers 124B and 224B in constant pitch section 24A gradually decreases from 1.000 to 0.980 and then is increased from 0.980 to 1.000 along a quadratic curve with respect to the positions of electrode fingers 124B and 224B. The ratio of the pitch between electrode fingers 123A and 123B of reflectors 23A and 23B to the pitch between electrode fingers 124B and 224B in constant pitch section 24A is 1.000. In IDT electrode 24, electrode fingers 124B and 224B are interdigitate with each other with in a width of 40 μm. This configuration as described above in the characteristic shown in FIG. 4 of the circuit shown in FIG. 3, provides the resonator with an attenuation characteristic that has depths or attenuation amounts at the attenuation pole caused by main resonance RP1 and the attenuation pole caused by auxiliary resonance RA1. Parallel-arm resonator 102 having this characteristic is used as parallel-arm resonator 7 shown in FIG. 1, providing antenna duplexer 1 with a high attenuation amount in the low frequency band.

Intermediate portion 424C in IDT electrode 24 other than end portions 424A and 424B has narrow pitch section 24B in which the pitches between electrode fingers 124B and 224B are locally narrow. This arrangement provides resonator 102 with main resonance RP1 and auxiliary resonance RA1 having a higher frequency than that of main resonance RP1. In narrow pitch section 24B, the pitches between electrode fingers 124B and 224B may be constant. The pitches of electrode fingers 124B and 224B may preferably gradually change with respect to the positions of electrode fingers 124B and 224B in narrow pitch section 24B. The pitches may linearly change with respect to the positions of electrode fingers 124B and 224B or may change along a function, such as a quadratic function.

Figure 6:
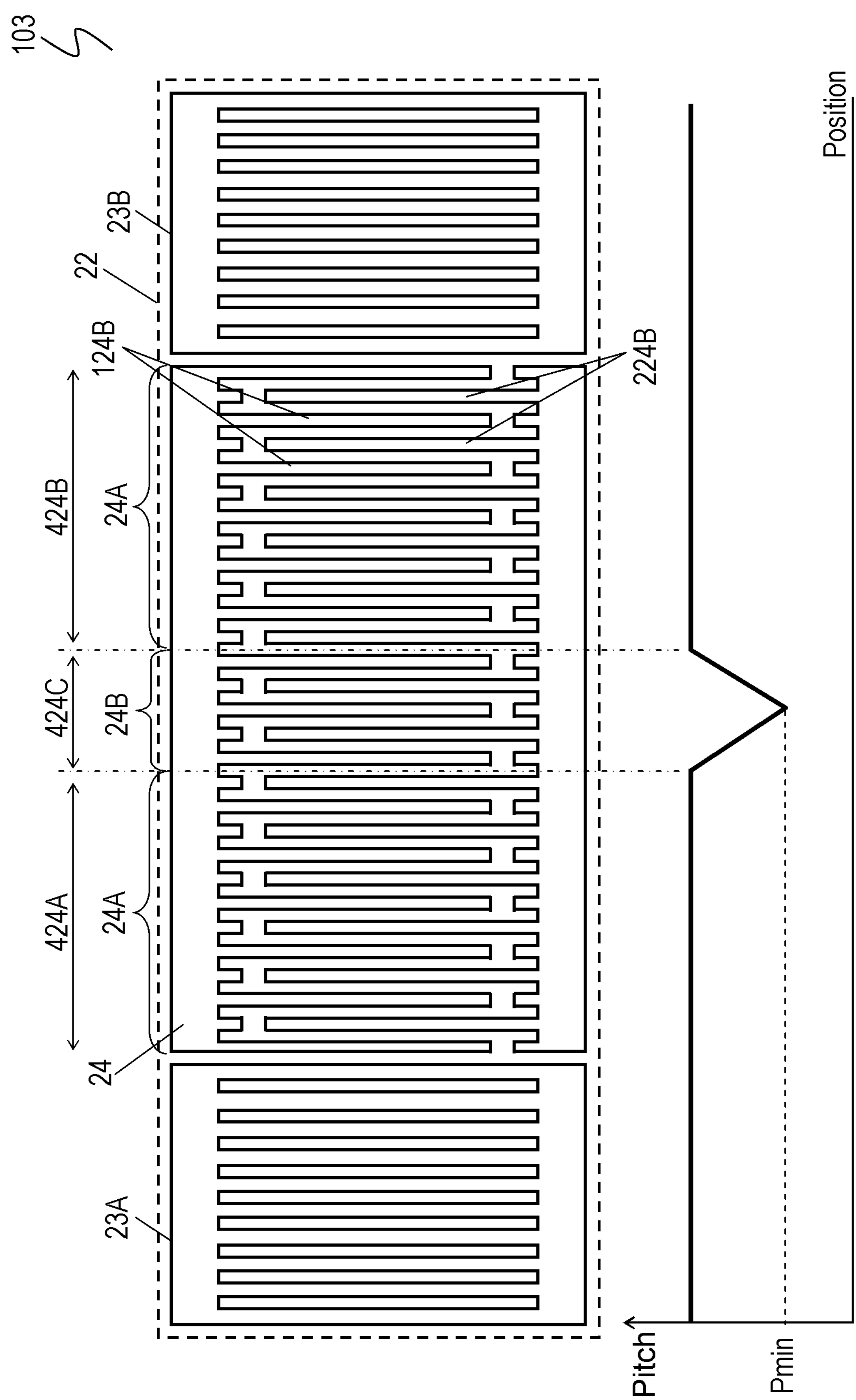
FIG. 6 is a schematic view of still another parallel-arm resonator of the antenna duplexer according to the embodiment.

FIG. 6 is a schematic view of still another parallel-arm resonator 103 having plural resonances that is at least one parallel-arm resonator out of parallel-arm resonators 7, 9, and 11 of filter 6 of antenna duplexer 1 according to the embodiment. In FIG. 6, components identical to those of parallel-arm resonator 102 shown in FIG. 3 are denoted by the same reference numerals. In parallel-arm resonator 103 shown in FIG. 6, when assuming that the pitch between electrode fingers 124B and 224B in constant pitch section 24A is 1.000, the minimum pitch Pmin that is the minimum value of the pitch of electrode fingers 124B and 224B in narrow pitch section 24B is 0.980. The pitch of electrode fingers 124B and 224B in narrow pitch section 24B gradually decreases from 1.000 to 0.980, and subsequently increases from the minimum pitch Pmin of 0.980 to 1.000 linearly with respect to the positions of electrode fingers 124B and 224B. Specifically, the minimum pitch Pmin of 0.980 is the minimum value of the ratio of the pitch of electrode fingers 124B and 224B in narrow pitch section 24B to the pitch of electrode fingers 124B and 224B in constant pitch section 24A. In narrow pitch section 24B, the ratio of the pitch of electrode fingers 124B and 224B gradually decreases from 1.000 to 0.980 and then, increases from 0.980 to 1.000 linearly with respect to the positions of electrode fingers 124B and 224B. Parallel-arm resonator 103 shown in FIG. 6 provides the same characteristic as parallel-arm resonator 102 shown in FIG. 5.

Figure 7:
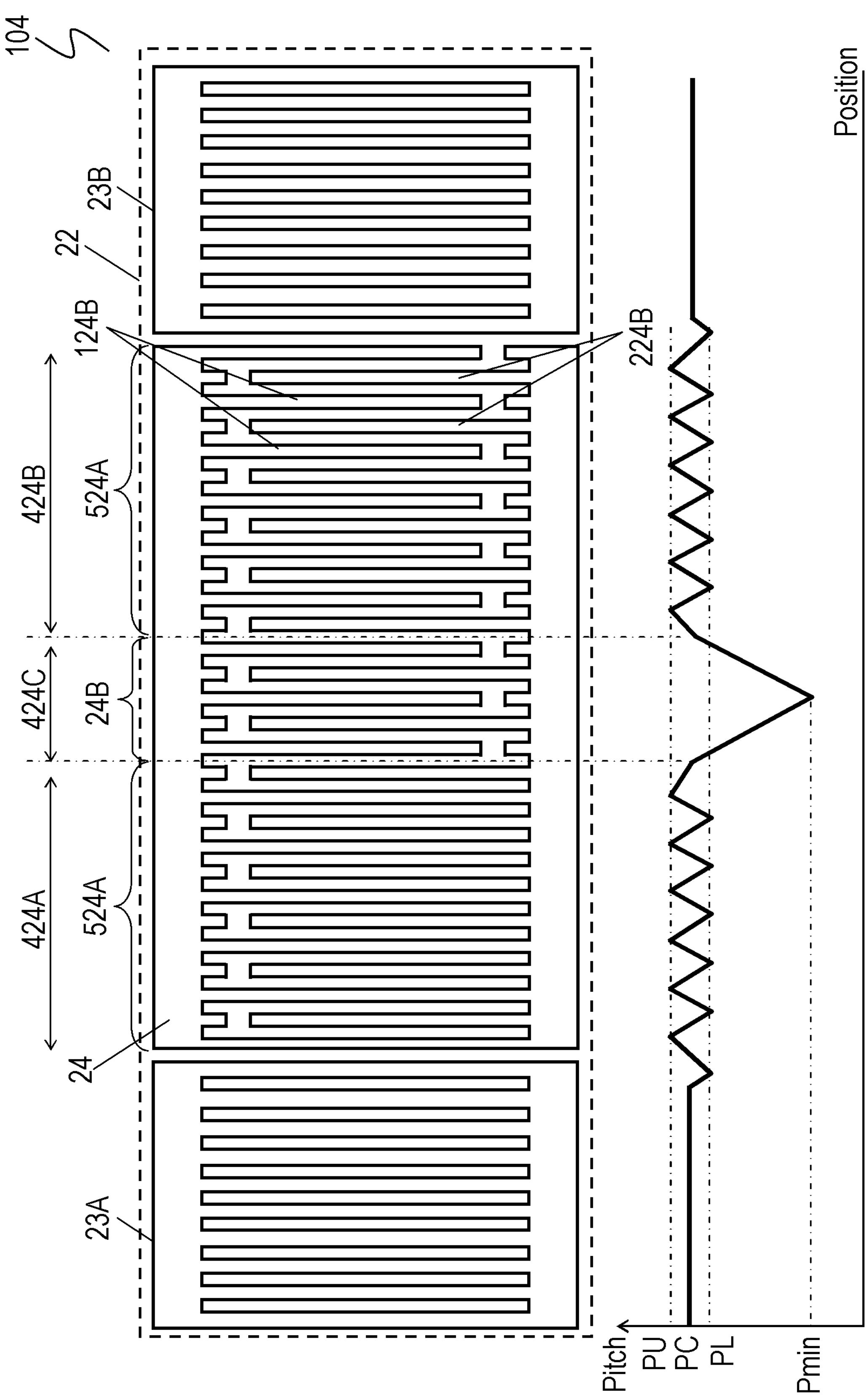
FIG. 7 is a schematic view of a further parallel-arm resonator of the antenna duplexer according to the embodiment.

FIG. 7 is a schematic view of further parallel-arm resonator 104 having plural resonances that is at least one parallel-arm resonator out of parallel-arm resonators 7, 9, and 11 of filter 6 of antenna duplexer 1 according to the embodiment. In FIG. 7, components identical to those of parallel-arm resonator 103 shown in FIG. 6 are denoted by the same reference numerals. IDT electrode 24 of parallel-arm resonator 104 shown in FIG. 7 includes oscillating pitch section 524A instead of constant pitch sections 24A provided in end portions 424A and 424B of IDT electrode 24 of parallel-arm resonator 103 shown in FIG. 6. In oscillating pitch section 524A, the pitch of electrode fingers 124B and 224B changes alternate to long pitch PU and short pitch PL about average pitch PC. Average pitch PC is an average of long pitch PU and short pitch PL. Long pitch PL is longer than the minimum pitch Pmin. Parallel-arm resonator 104 can be configured, as in parallel-arm resonators 102 and 103 shown in FIGS. 5 and 6, to have two resonances, main resonance RP1 and auxiliary resonance RA1 shown in FIG. 5, to have an effect to reduce the difference between resonance frequency fr1 of main resonance RP1 and an antiresonance frequency, thus controlling the attenuation pole frequency while suppressing the deterioration of the filter pass characteristic.

Figure 8:
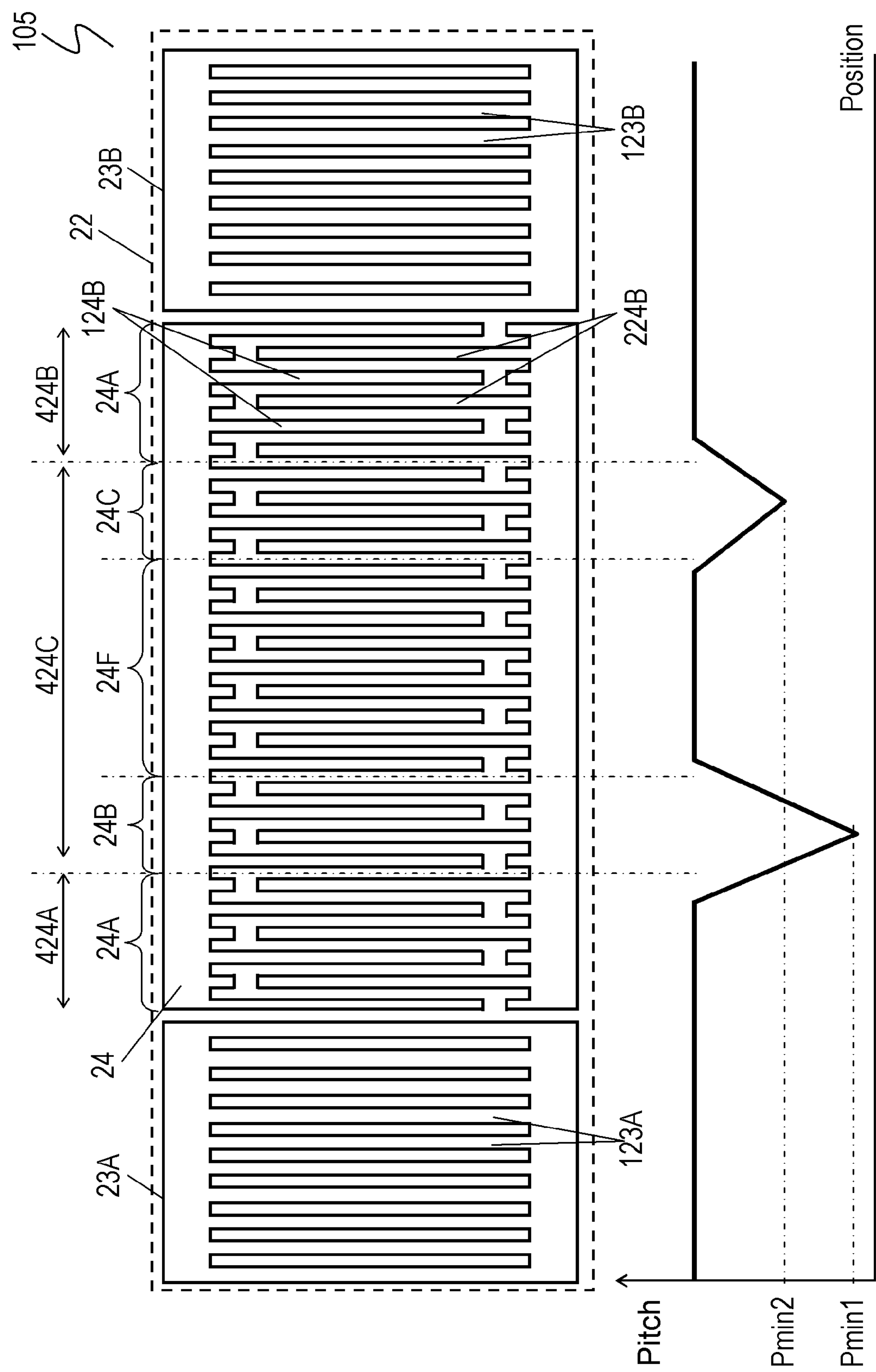
FIG. 8 is a schematic view of a further parallel-arm resonator of the antenna duplexer according to the embodiment.

FIG. 8 is a schematic view of further parallel-arm resonator 105 having plural resonances of at least one parallel-arm resonator out of parallel-arm resonators 7, 9, and 11 of filter 6 of antenna duplexer 1 according to the embodiment. In FIG. 8, components identical to those of parallel-arm resonator 103 shown in FIG. 6 are denoted by the same reference numerals. Parallel-arm resonator 105 shown in FIG. 8 has a main resonance and two auxiliary resonances. Intermediate portion 424C between end portions 424A and 424B of IDT electrode 24 has one constant pitch section 24F and two narrow pitch sections 24B and 24C. Specifically, narrow pitch section 24B is positioned in intermediate portion 424C and is adjacent to end portion 424A. Narrow pitch section 24C is positioned in intermediate portion 424C and is adjacent to end portion 424B. In intermediate portion 424C of IDT electrode 24, constant pitch section 24F is located between narrow pitch sections 24B and 24C. In end portions 424A and 424B and constant pitch sections 24A and 24F in intermediate portion 424C, electrode fingers 124B and 224B are arranged at an identical pitch. Minimum pitch Pmin1 of electrode fingers 124B and 224B in narrow pitch section 24B is different from minimum pitch Pmin2 of electrode fingers 124B and 224B in narrow pitch section 24C. The number of electrode fingers 124B and 224B in narrow pitch section 24B is different from the number of electrode fingers 124B and 224B in narrow pitch section 24C. This structure provides parallel-arm resonator 105 with two auxiliary resonances. Thus, attenuation poles caused by the main resonance and the two auxiliary resonances have a substantially-uniform attenuation amount. Resonator 105 having the three resonances as described above provides a wider band attenuation characteristic than resonator 101 shown in FIG. 2 having two resonances having the same capacitance. Resonator 105 can decrease impedance between the main resonance and a first auxiliary resonance or impedance between the first auxiliary resonance and a second auxiliary resonance, and increases the impedance at the frequencies in the circuit shown in FIG. 3. This can consequently suppress the insertion loss of filter 5 when resonator 105 is used as the parallel-arm resonator of antenna duplexer 1.

As described above, at least one resonator of parallel-arm resonators 7, 9, and 11 with the three resonances, the main resonance and the two auxiliary resonances is resonator 105. Three attenuation poles caused by the main resonance and the two auxiliary resonances are within the low frequency band, and provide antenna duplexer 1 with a high attenuation characteristic and a high isolation characteristic while maintaining the insertion loss.

In parallel-arm resonator 105, two auxiliary resonances can be realized by causing, in narrow pitch sections 24B and 24C, the pitch of electrode fingers 124B and 224B to be different from each other. Two auxiliary resonances may be realized by changing the number of electrode fingers 124B and 224B in narrow pitch section 24B to the number of electrode fingers 124B and 224B in narrow pitch section 24C. Alternatively, two auxiliary resonances may be realized by differentiating the number and pitch of electrode fingers 124B and 224B in narrow pitch section 24B from the number and pitch of electrode fingers 124B and 224B in narrow pitch section 24C.

The pitch may change linearly with respect to the positions of electrode fingers 124B and 224B or may change along another function, such as a quadratic function.

Since the three attenuation poles caused by the three resonances, the main resonance and the two auxiliary resonances, are within the low frequency band, a higher attenuation characteristic is favorably obtained while maintaining a low insertion loss without increasing the number of the resonators. Filter 6 including resonator 105 having the three resonances, the main resonance and the two auxiliary resonances, has a higher impedance in the low frequency band than a filter including an antenna duplexer using a parallel-arm resonator having two resonances and a parallel-arm resonator having two resonance frequencies provided in the low frequency band. Thus, when filter 5 and filter 6 are connected by antenna terminal 3, the impedance of filter 6 seen from antenna terminal 3 is higher in the low frequency band. This can prevent an increase of the insertion loss in filter 5 due to the connection to filter 6, thus providing antenna duplexer 1 having a low insertion loss.

The configuration of a sample of resonator 105 shown in FIG. 8 will be detained below. In the sample, electrode fingers 124B and 224B of IDT electrode 24 interdigitate with each other along a width of 20 μm. Constant pitch section 24A at end portions 424A and 424B of IDT electrode 24 has sixty electrode fingers 124B and sixty electrode fingers 224B, respectively. Constant pitch section 24F in intermediate portion 424C has one hundred twenty electrode fingers 124B and one hundred twenty electrode fingers 224B, respectively. Each of narrow pitch sections 24B and 24C has thirty electrode fingers 124B and thirty electrode fingers 224B, respectively. When assuming that the pitch of electrode fingers 124B and 224B in constant pitch sections 24A and 24F is 1.000, the pitch changes linearly while minimum pitch Pmin1 of electrode fingers 124B and 224B in narrow pitch section 24B is 0.983, thus forming a locally-minimum pitch portion. The ratio changes linearly so that the narrow pitch section 24C has minimum pitch Pmin2 of 0.9900, thereby forming a locally-minimum pitch portion. Specifically, the pitches change linearly so that the ratio of the minimum pitch of electrode fingers 124B and 224B in narrow pitch section 24B to the pitch of electrode fingers 124B and 224B in constant pitch sections 24A and 24F is 0.983, thereby forming a locally-minimum pitch portion of the electrode fingers. The pitches change linearly so that the ratio of the minimum pitch in narrow pitch section 24C to the pitch of electrode fingers 124B and 224B in constant pitch sections 24A and 24F is 0.9900, thereby forming a locally-minimum pitch portion of the electrode fingers. The reflector 23A includes thirty 30 electrode fingers 123A. The ratio of the pitch of electrode fingers 123A in constant pitch sections 24A and 24F to the pitch of electrode fingers 124B and 224B is fixed to 1.000. Reflector 23B includes thirty electrode fingers 123B. The ratio of the pitch of electrode finger 123B in constant pitch sections 24A and 24F to the pitch of electrode fingers 124B and 224B is fixed to 1.000.

Figure 9:
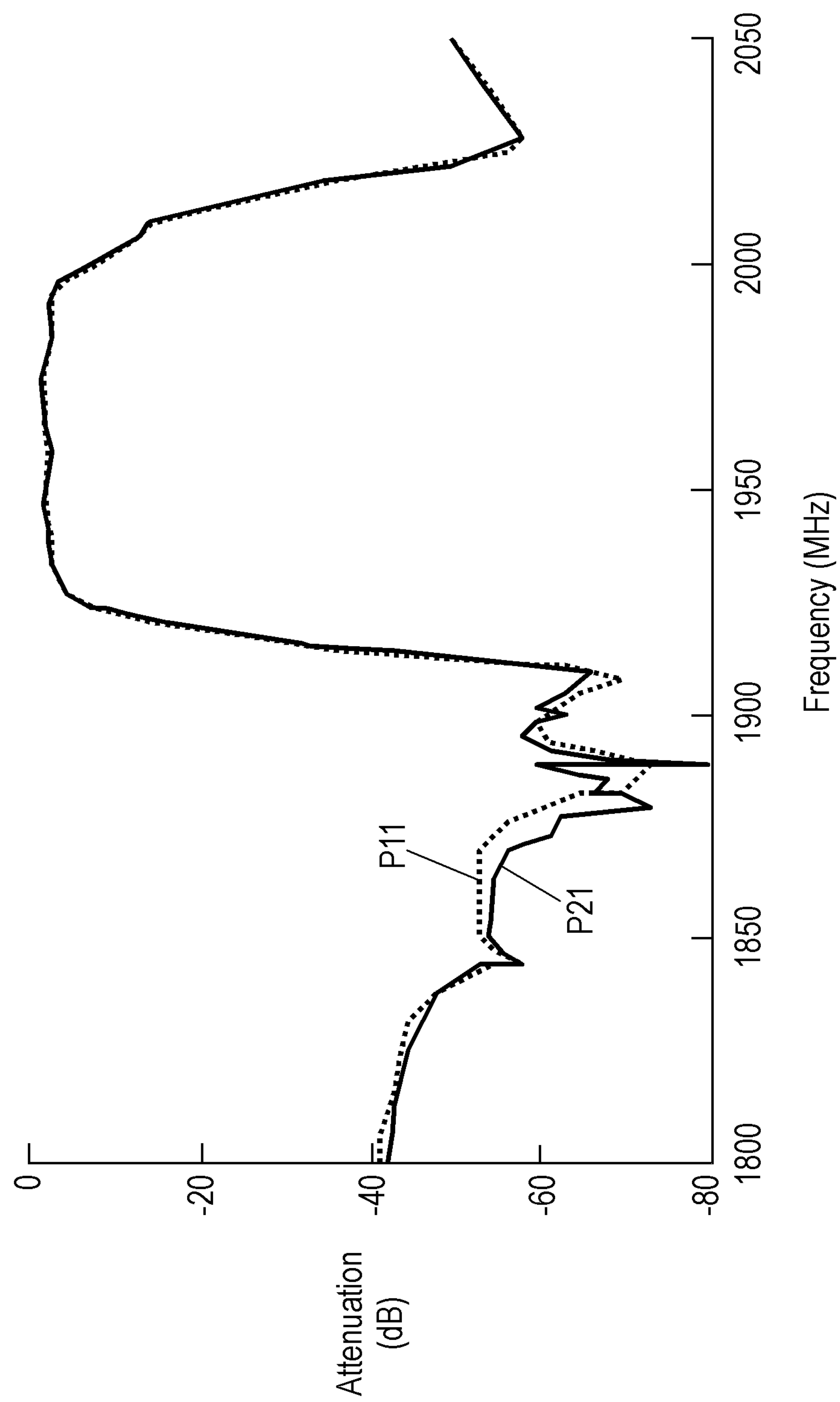
FIG. 9 illustrates a characteristic of a reception filter of the antenna duplexer including the parallel-arm resonator shown in FIG. 8.

FIG. 9 illustrates characteristics of filter 6 of antenna duplexer 1 including parallel-arm resonator 105 shown in FIG. 8 is used as parallel-arm resonator 7 shown in FIG. 1. Antenna duplexer 1 shown in FIG. 9 is, specifically, an antenna duplexer for Band 2 (transmission frequency: 1850 to 1910 MHz, reception frequency: 1930 to 1990 MHz) of Universal Mobile Telecommunications System (UMTS). Profile P11 shows the characteristic of filter 6 of an antenna duplexer as a comparative example in which all resonators 7 to 21 shown in FIG. 1 are ordinary resonators having only a main resonance. Profile P21 shows the characteristic of filter 6 of antenna duplexer 1 including resonator 105 in which parallel-arm resonator 7 has a main resonance and two auxiliary resonances. In FIG. 9, profile P21 shows an attenuation amount at the transmission frequency (low frequency band) than that of profile P11 by a difference of 2 dB.

Figure 10:
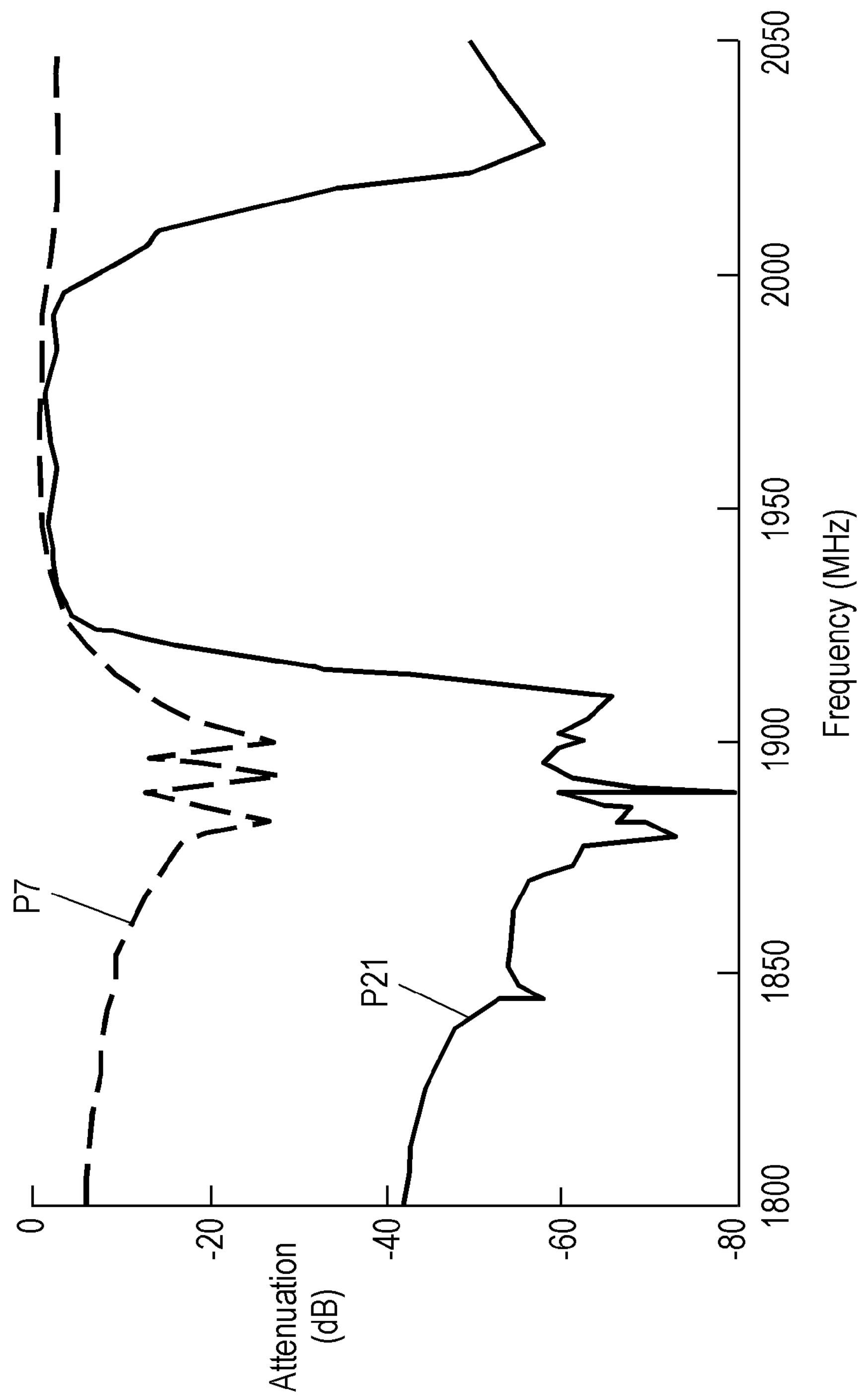
FIG. 10 illustrates characteristic of the parallel-arm resonator shown in FIG. 8.

FIG. 10 shows the characteristic of filter 6 having profile P21 of antenna duplexer 1 including resonator 105 having a main resonance and two auxiliary resonance in parallel-arm resonator 7 and attenuation profile P7 of parallel-arm resonator 7. As shown in FIG. 10, the attenuation pole caused by the main resonance of parallel-arm resonator 7 (105) is positioned near 1880 MHz and the attenuation pole caused by the first auxiliary resonance is positioned near 1892 MHz and the attenuation pole caused by the second auxiliary resonance is positioned near 1900 MHz. Regarding the attenuation characteristics in the transmission frequency band (low frequency band), parallel-arm resonator 7 (105) slightly contributes to the attenuation near 1910 MHz and widely contributes to the attenuation near frequencies of 1880 to 1900 MHz.

Figure 11:
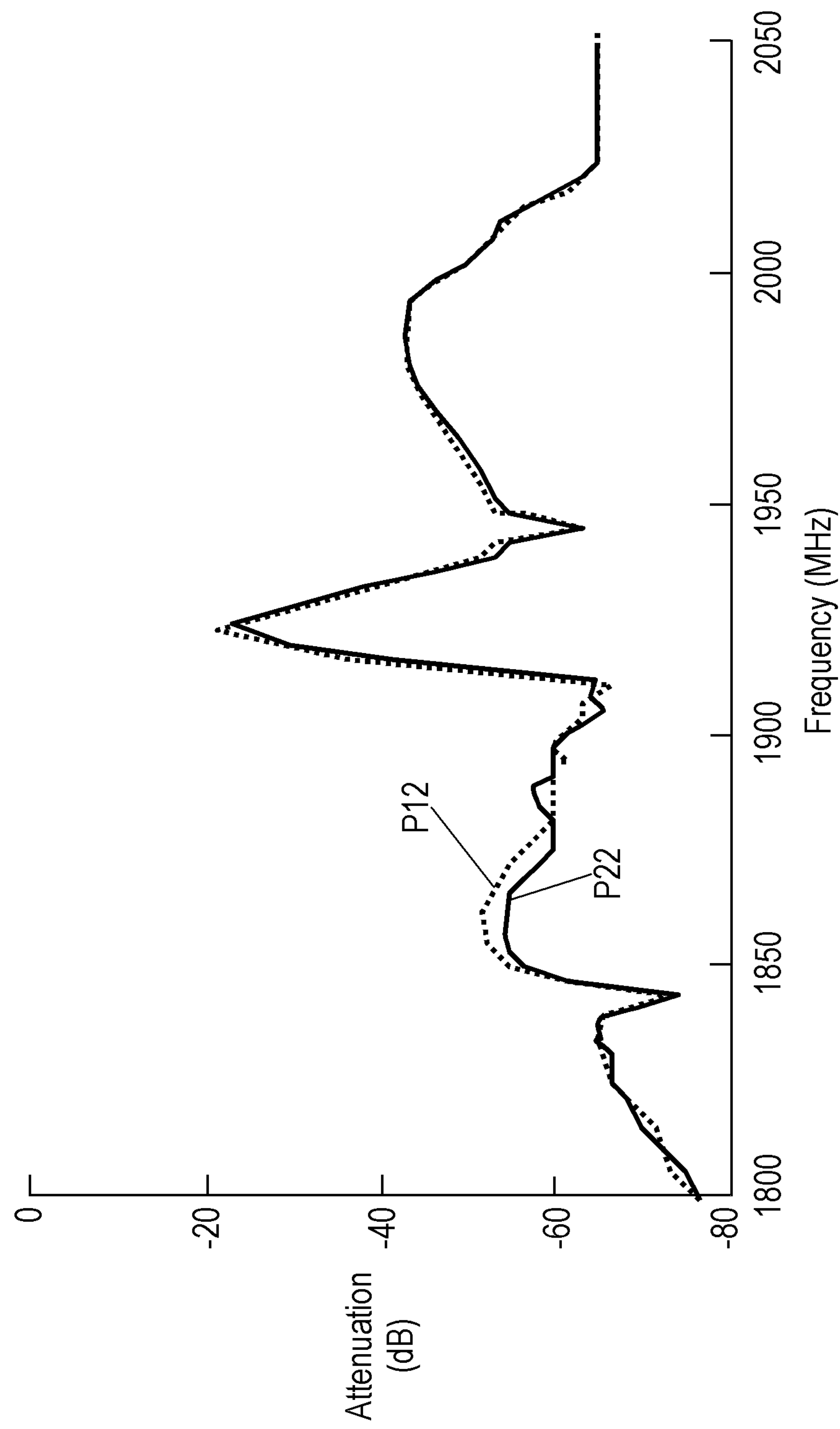
FIG. 11 illustrates an isolation characteristic of an antenna duplexer including the parallel-arm resonator shown in FIG. 8.

FIG. 11 shows isolation profile P22 of antenna duplexer 1 for Band 2 according to the embodiment. FIG. 11 also shows profile P12 of filter 6 of an antenna duplexer as a comparative example that is an ordinary resonator for which all resonators 7 to 21 shown in FIG. 1 has the main resonance only. As shown in FIG. 11, antenna duplexer 1 including resonator 105 in which parallel-arm resonator 7 has the main resonance and two auxiliary resonances has isolation more by 2 dB in the transmission frequency band (low frequency band) due to the improved attenuation characteristic than the antenna duplexer of the comparative example.

As described above, resonator 105 according to the embodiment can provide antenna duplexer 1 with a small size, a preferable attenuation characteristic and isolation characteristic.

Figure 12:
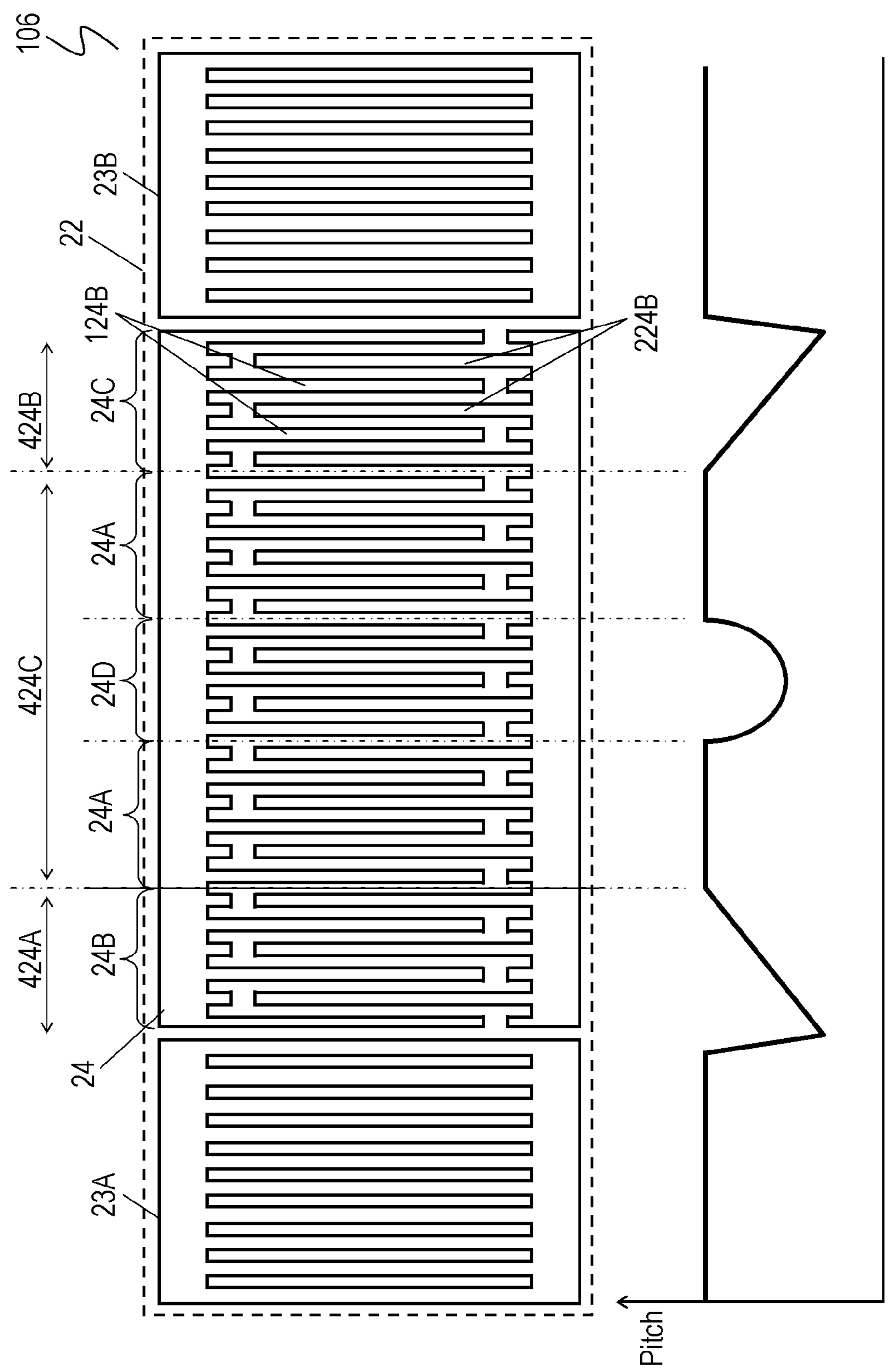
FIG. 12 is a schematic view of a further parallel-arm resonator of the antenna duplexer according to the embodiment.

FIG. 12 is a schematic view of further parallel-arm resonator 106 having plural resonances that is at least one parallel-arm resonator out of parallel-arm resonators 7, 9, and 11 of filter 6 of antenna duplexer 1 according to the embodiment. In FIG. 12, components identical to those of parallel-arm resonator 101 shown in FIG. 2 are denoted by the same reference numerals. In parallel-arm resonator 106, narrow pitch sections 24B and 24C are provided in end sections 424A and 424B of IDT electrode 24, respectively. Constant pitch sections 24A are provided in intermediate portion 424C adjacent to end portions 424A and 424B. Narrow pitch section 24D is positioned between constant pitch sections 24A. In narrow pitch section 24D shown in FIG. 12, electrode fingers 124B and 224B are arranged with a shorter pitch than that in constant pitch section 24A. Resonator 106 also has a main resonance and two auxiliary resonances. More narrow pitch sections in IDT electrode 24 increase the number of the auxiliary resonances.

However, if a resonator having four or more resonances, a main resonance and three or more auxiliary resonances, is used as parallel-arm resonator 7, the attenuation amount at the attenuation pole by the main resonance of parallel-arm resonator 7 cannot be increased. Thus, such an increase may not be useful for antenna duplexer 1.

The parallel-arm resonator having four resonances tends to have a low Q value of the main resonance (acutance). Thus, when such a parallel-arm resonator is used as a parallel-arm resonator, insufficient attenuation amount is caused. Thus, a resonator having three resonances is preferably used for parallel-arm resonator 7.

Figure 13:
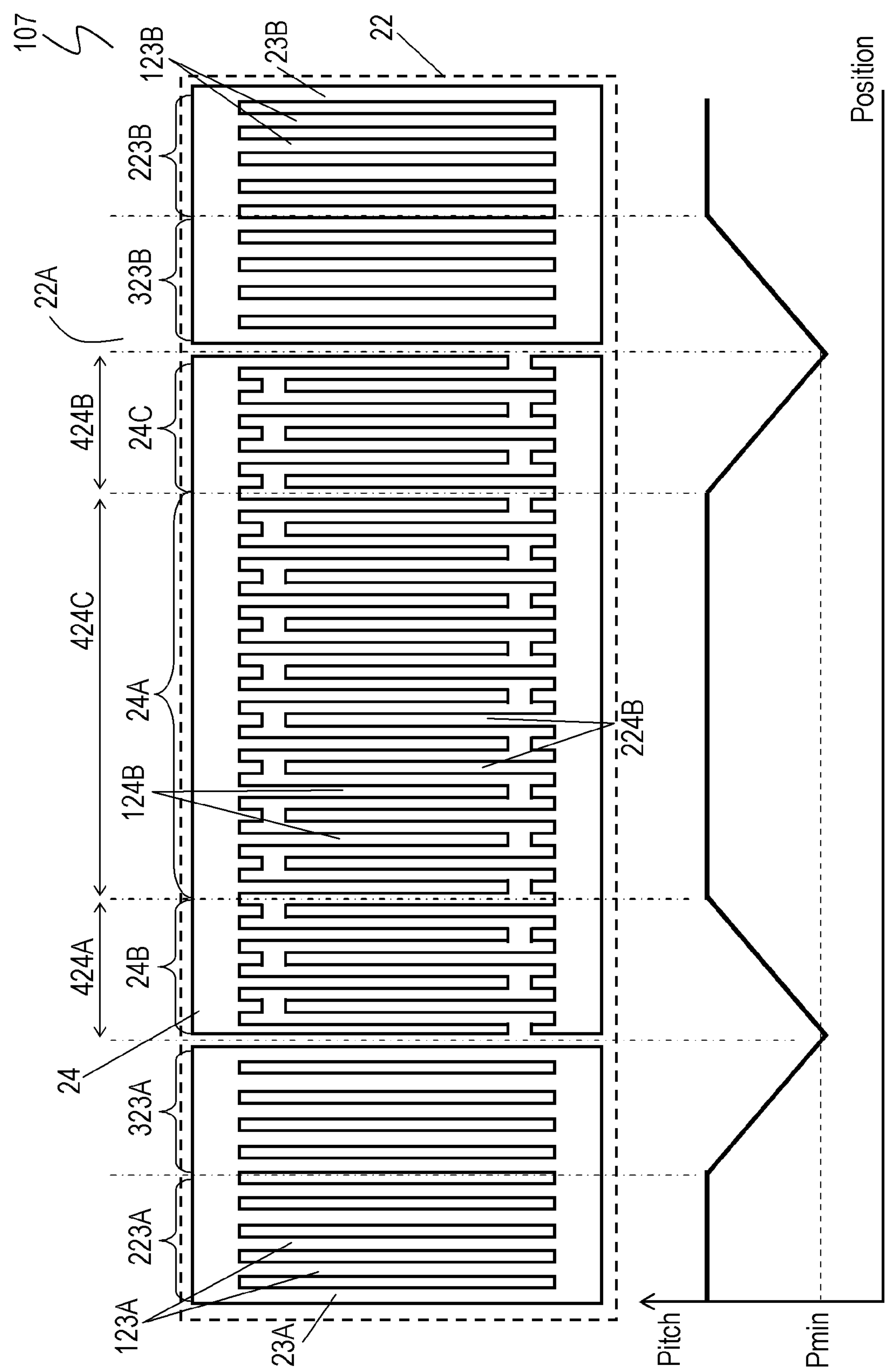
FIG. 13 is a schematic view of a further parallel-arm resonator of the antenna duplexer according to the embodiment.

FIG. 13 is a schematic view of further parallel-arm resonator 107 having plural resonances that is at least one parallel-arm resonator among parallel-arm resonators 7, 9, and 11 of filter 6 of antenna duplexer 1 according to the embodiment. In FIG. 13, components identical to those of parallel-arm resonator 101 shown in FIG. 2 are denoted by the same reference numerals. In parallel-arm resonator 107 shown in FIG. 13, reflector 23A has narrow pitch section 323A provided in a region adjacent to IDT electrode 24 and constant pitch section 223A which is farther from IDT electrode 24 than narrow pitch section 323A is. Reflector 23B has narrow pitch section 323B provided in a region adjacent to IDT electrode 24 and constant pitch section 223B which is farther from IDT electrode 24 than narrow pitch section 323B is. In constant pitch sections 223A and 223B, as in reflectors 23A and 24B of parallel-arm resonator 101 shown in FIG. 2, electrode fingers 123A and 123B are arranged at the same pitch as that in constant pitch section 24A of IDT electrode 24. In narrow pitch sections 323A and 323B, electrode fingers 123A and 123B are arranged at a narrower pitch than that in constant pitch sections 223A and 223B. This configuration can realize two resonances, a main resonance and an auxiliary resonance.

As described above, antenna duplexer 1 according to the embodiment has a superior isolation characteristic, and thus, is useful for an electronic device, such as mobile communication device.

What is claimed is:

1. An antenna duplexer comprising:

an antenna terminal configured to be connected to an antenna;

a first terminal configured to be connected to a first external circuit;

a second terminal configured to be connected to a second external circuit;

a first filter connected in series between the antenna terminal and the first terminal, the first filter having a passband in a low frequency band; and a second filter connected in series between the antenna terminal and the second terminal, the second filter having a passband in a high frequency band having a lowest frequency higher than a highest frequency of the low frequency band, the second filter including a plurality of series-arm resonators connected in series between the antenna terminal and the second terminal, and a plurality of parallel-arm resonators connected between a ground and the plurality of series-arm resonators to form a ladder-type filter together with the plurality of series-arm resonators, the plurality of parallel-arm resonators of the second filter including a first parallel-arm resonator connected at a position closest to the antenna terminal among the plurality of parallel-arm resonators, and a plurality of second parallel-arm resonators connected at positions farther from the antenna terminal than the first parallel-arm resonator, at least one second parallel-arm resonator out of the plurality of second parallel-arm resonators having a main resonance and a first auxiliary resonance, attenuation poles caused by the main resonance and the first auxiliary resonance being within the low frequency band.

2. The antenna duplexer of claim 1 wherein the at least one second parallel-arm resonator further has a second auxiliary resonance, and an attenuation pole caused by the second auxiliary resonance is within the low frequency band.

3. The antenna duplexer of claim 1 wherein the at least one second parallel-arm resonator includes an interdigital transducer (IDT) electrode having pair of busbars and a plurality of electrode fingers that extend from the pair of busbars and that interdigitate with each other, the at least one second parallel-arm resonator having a first narrow pitch section in which a pitch of the plurality of electrode fingers is reduced.

4. The antenna duplexer of claim 3 wherein the first narrow pitch section is provided at an end portion of the IDT electrode.

5. The antenna duplexer of claim 3 wherein the first narrow pitch section is provided in an intermediate portion between both end portions of the IDT electrode.

6. The antenna duplexer of claim 3 wherein the at least one second parallel-arm resonator further has a second narrow pitch section in which a pitch of the plurality of electrode fingers is reduced.

7. The antenna duplexer of claim 6 wherein the first narrow pitch section and the second narrow pitch section are provided in an intermediate portion between both end portions of the IDT electrode.

8. The antenna duplexer of claim 1 wherein the at least one second parallel-arm resonator is connected at a position farthest from the antenna terminal among the plurality of second parallel-arm resonators.

9. The antenna duplexer of claim 1 wherein a resonance frequency of the first auxiliary resonance of the at least one second parallel-arm resonator is lower than resonance frequencies of a plurality of parallel-arm resonators out of the plurality of parallel-arm resonators other than the at least one second parallel-arm resonator.

10. An antenna duplexer comprising:

an antenna terminal;

a first filter connected in series between the antenna terminal and an input terminal, the first filter having a first passband in a first frequency band; and a second filter connected in series with the first filter between the input terminal and an output terminal, the antenna terminal being positioned between the first and second filters, the second filter having a second passband in a second frequency band higher than the first frequency band, the first and second frequency bands being non-overlapping, the second filter including a plurality of series-arm resonators connected in series between the antenna terminal and the output terminal to form a series arm of the second filter, and a plurality of parallel-arm resonators connected interspersed with the plurality of series-arm resonators between a ground and the series arm, the plurality of parallel-arm resonators including a first parallel-arm resonator connected at a position farthest from the antenna terminal among the plurality of parallel-arm resonators, and at least one second parallel-arm resonator connected at positions closer to the antenna terminal than the first parallel-arm resonator, a first second parallel-arm resonator of the at least one second parallel-arm resonator having a main resonance and a first auxiliary resonance that produce attenuation poles within the first frequency band.

11. The antenna duplexer of claim 10 further including a phase shifter connected between the antenna terminal and the ground.

12. The antenna duplexer of claim 10 wherein the first parallel-arm resonator includes first and second reflectors, and an interdigital transducer (IDT) electrode having pair of busbars and a plurality of electrode fingers that extend from the pair of busbars and that interdigitate with each other, the IDT electrode being positioned between the first and second reflectors.

13. The antenna duplexer of claim 12 wherein the IDT electrode includes a constant pitch section in which a first group of the plurality of electrode fingers are arranged at a substantially constant first pitch, and at least one narrow pitch section in which a second group of the plurality of electrode fingers are arranged at a varying pitch that changes linearly between the substantially constant first pitch and a minimum pitch that is narrower than the substantially constant first pitch.

14. The antenna duplexer of claim 13 wherein the at least one narrow pitch section is disposed in an intermediate portion between both end portions of the IDT electrode.

15. The antenna duplexer of claim 14 wherein the at least one narrow pitch section includes a first narrow pitch section and a second narrow pitch sections spaced apart from one another.

16. The antenna duplexer of claim 15 wherein the first parallel-arm resonator has a second auxiliary resonance that produces an additional attenuation pole within the first frequency band.

17. The antenna duplexer of claim 12 wherein the IDT electrode includes first and second narrow pitch sections in which electrode fingers of the plurality of electrode are arranged with varying pitch, and constant pitch sections positioned on both sides of each of the first and second narrow pitch sections in which electrode fingers of the plurality of electrode fingers are arranged at a substantially constant first pitch.

18. The antenna duplexer of claim 17 wherein, in the first narrow pitch section, the varying pitch changes linearly between the first pitch and a first local minimum pitch, and in the second narrow pitch section, the varying pitch changes linearly between the first pitch and a second local minimum pitch that is narrower than the first local minimum pitch.

19. A communications device comprising:

an antenna;

a first filter having a first passband in a first frequency band;

a transmission circuit configured to input a transmission signal to the antenna via the first filter, the first filter being connected in series between the transmission circuit and the antenna, the transmission signal having a frequency within the first frequency band;

a reception circuit configured to receive a reception signal from the antenna; and a second filter having a second passband in a second frequency band having a lowest frequency higher than a highest frequency of the first frequency band, the second filter being connected in series between the antenna and the reception circuit and configured to pass the reception signal from the antenna to the reception circuit, the reception signal having a frequency within the second frequency band, the second filter including a plurality of series-arm resonators connected in series between the antenna and the reception circuit to form a series arm of the second filter, and a plurality of parallel-arm resonators connected interspersed with the plurality of series-arm resonators between a ground and the series-arm, the plurality of parallel-arm resonators of the second filter including a first parallel-arm resonator connected at a position closest to the antenna terminal among the plurality of parallel-arm resonators, and a plurality of second parallel-arm resonators connected at positions farther from the antenna terminal than the first parallel-arm resonator, at least one second parallel-arm resonator out of the plurality of second parallel-arm resonators having a main resonance and a first auxiliary resonance that produce attenuation poles within the first frequency band.

20. The communications device of claim 19 wherein the at least one second parallel-arm resonator further has a second auxiliary resonance, and an attenuation pole caused by the second auxiliary resonance is within the first frequency band.

* * * * *